(12) United States Patent
Chambion

(10) Patent No.: US 10,820,407 B2
(45) Date of Patent: Oct. 27, 2020

(54) ELECTRONIC STRUCTURE COMPRISING A MATRIX ARRAY OF ELECTRONIC DEVICES HAVING IMPROVED THERMAL PERFORMANCES

(71) Applicant: COMMISSARIAT A L'ENERGIE ATOMIQUE ET AUX ENERGIES ALTERNATIVES, Paris (FR)

(72) Inventor: Bertrand Chambion, Pontcharra (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/474,955

(22) PCT Filed: Dec. 22, 2017

(86) PCT No.: PCT/EP2017/084470
§ 371 (c)(1),
(2) Date: Jun. 28, 2019

(87) PCT Pub. No.: WO2018/122188
PCT Pub. Date: Jul. 5, 2018

(65) Prior Publication Data
US 2019/0342987 A1    Nov. 7, 2019

(30) Foreign Application Priority Data
Dec. 30, 2016 (FR) ....................... 16 63544

(51) Int. Cl.
*H05K 1/02* (2006.01)
*H05K 1/14* (2006.01)
(Continued)

(52) U.S. Cl.
CPC ............ *H05K 1/0204* (2013.01); *H05B 45/48* (2020.01); *H05K 1/144* (2013.01); *H05K 1/181* (2013.01);
(Continued)

(58) Field of Classification Search
CPC ............ H05K 1/14; H05K 1/144; H05K 1/02; H05K 1/0204; H05K 1/0209;
(Continued)

(56) References Cited

U.S. PATENT DOCUMENTS 4,631,686 A * 12/1986 Ikawa ............... H03K 19/17704
257/E21.602
10,388,635 B2 * 8/2019 Xin ......................... H01L 33/56
(Continued)

FOREIGN PATENT DOCUMENTS

GB      2 501 758 A    11/2013

OTHER PUBLICATIONS

International Search Report as issued in International Patent Application No. PCT/EP2017/084470, dated Apr. 11, 2018.

*Primary Examiner* — Thai Pham
(74) *Attorney, Agent, or Firm* — Pillsbury Winthrop Shaw Pittman LLP

(57) ABSTRACT

An electronic structure includes a plurality of electronic devices arranged in the form of a matrix array including a first number of rows, the electronic devices of each row being connected in series, the matrix array further including a plurality of switches, the rows of the matrix array being distributed in a second number of groups intended to be connected in series by the switches, the groups connected in series being supplied with an electrical supply current, at least one of the groups including at least two rows connected in parallel so as to distribute the supply current between the at least two rows.

9 Claims, 4 Drawing Sheets

(51) Int. Cl.
 *H05K 1/18* (2006.01)
 *H05B 45/48* (2020.01)
(52) U.S. Cl.
 CPC ............ *H05K 2201/042* (2013.01); *H05K 2201/10053* (2013.01); *H05K 2201/10106* (2013.01); *H05K 2201/10522* (2013.01); *H05K 2201/10734* (2013.01)
(58) Field of Classification Search
 CPC ............ H05K 1/0289; H05K 2201/04; H05K 2201/041; H05K 2201/10106; H05B 33/08; H05B 33/083; H05B 33/0842
 See application file for complete search history.

(56) References Cited

U.S. PATENT DOCUMENTS

| | | | |
|---|---|---|---|
| 2006/0232219 A1* | 10/2006 | Xu | H05B 33/0809 |
| | | | 315/209 R |
| 2007/0217210 A1* | 9/2007 | Jeong | H05B 45/40 |
| | | | 362/428 |
| 2010/0141167 A1* | 6/2010 | Kato | G02F 1/133603 |
| | | | 315/287 |
| 2010/0320483 A1 | 12/2010 | Kadotani et al. | |
| 2011/0309381 A1* | 12/2011 | Betsuda | F21S 8/04 |
| | | | 257/88 |
| 2014/0232288 A1 | 8/2014 | Brandes et al. | |
| 2014/0247597 A1 | 9/2014 | Abe et al. | |
| 2016/0178177 A1 | 6/2016 | Ebner | |
| 2018/0174504 A1* | 6/2018 | Yoneoka | G09G 3/32 |

* cited by examiner

US 10,820,407 B2

ELECTRONIC STRUCTURE COMPRISING A MATRIX ARRAY OF ELECTRONIC DEVICES HAVING IMPROVED THERMAL PERFORMANCES

CROSS REFERENCE TO RELATED APPLICATIONS

This application is the U.S. National Stage of PCT/EP2017/084470, filed Dec. 22, 2017, which in turn claims priority to French Patent Application No. 1663544 filed Dec. 30, 2016, the entire contents of all applications are incorporated herein by reference in their entireties.

TECHNICAL FIELD OF THE INVENTION

The present invention relates to electronic structures comprising electronic devices arranged in the form of a matrix array, and more specifically the improvement of the thermal performances of such a structure.

The present invention applies particularly, but not exclusively, to light emitting device structures intended to operate at high voltage.

TECHNOLOGICAL BACKGROUND OF THE INVENTION

Light emitting diode structures exist that are intended for operation at high voltage, that is to say being able to be supplied directly by an alternating supply voltage delivered by an electrical supply network, such as the home network. Such a structure 1 is illustrated in top view in FIG. 1. The structure 1 comprises a plurality of light emitting diodes 111 arranged in the form of a matrix array 11 comprising a number N of rows $L_i$ of index i, i being a natural integer comprised between 1 and N. For example, the number N of rows in the matrix array 11 of FIG. 1 is equal to 8. The light emitting diodes 111 of each row $L_i$ are connected in series. In addition, the rows $L_i$ may be connected in series by means of switches 112 arranged at the end of a row, as illustrated in FIG. 1.

FIG. 2 is a sectional view of the structure 1 along the plane of section I-I of FIG. 1. The structure 1 comprises a control device 12 configured to control the switches 112 in a dynamic manner. The two components, which are the matrix array 11 and the control device 12, are manufactured independently of each other before being assembled one on the other by means of an interconnection layer 13, which explains this denomination of structure. The interconnection layer 13 comprises balls 131 of a fusible material that form electrical, mechanical and thermal connections, between the matrix array 11 and the control device 12. This type of assembly, designated "flip-chip", is known from the microelectronics industry. The balls 131 act as thermal drains in order to dissipate the heat generated by the light emitting diodes 111 which are the main source of heat in the structure 1.

The control device 12 determines the value of the supply voltage supplied at the input of the structure 1 and, as a function of this value, supplies as many rows $L_i$ as possible by connecting them in series. When the supply voltage increases, the rows $L_i$ of the matrix array 11 are connected in series following an increasing order of indices i of rows $L_i$, that is to say beginning with the first row $L_1$ to end with the final row $L_N$. When the supply voltage decreases, the rows $L_i$ are disconnected following the reverse order, that is to say beginning with the final row $L_N$ to end with the first row $L_1$. Consequently, the first row $L_1$ is more often supplied than the final row $L_N$. The result is an electricity energy consumption that is not distributed in a homogeneous manner between the different rows $L_i$ of the matrix array 11, which is reflected by temperature differences within the matrix array 11. This phenomenon is illustrated in FIG. 3.

FIG. 3 is a mapping of the temperature on the surface of the matrix array 11 of FIG. 1. The light emitting diodes 111 have a limit operating temperature of around 150° C., the temperature above which they are damaged. FIG. 3 shows that a maximum temperature $T_{max}$ of around 130° C., close to the limit temperature, is reached at the level of the first row $L_1$. The light emitting diodes 111 of the first row $L_1$ thus risk being damaged.

FIG. 3 also shows that a minimum temperature $T_{min}$ of around 33° C. is obtained at the level of the final row $L_N$. The temperature differences to which the matrix array 11 is subjected are important, with a thermal gradient that can reach nearly 100° C. This high thermal gradient implies damageable thermomechanical consequences for the matrix array 11. Indeed, the hot zones of the matrix array 11 are going to expand more than the cold zones, which can lead to the formation of fissures in the matrix array 11, or in the worst of cases to a rupture of the matrix array 11.

This phenomenon of thermal gradient is accentuated by constraints linked to the assembly of the matrix array 11 on the control device 12. Ideally, a ball 131 should be arranged under each light emitting diode 111 to dissipate a maximum of heat. In practice, it is not however possible to place a ball 131 under certain light emitting diodes 111, for example when the zone of the control device 12 situated opposite comprises a sensitive element, for problems of integration density, circuit design constraints, or instead power supply track passage constraints. The interconnection layer 13 has free spaces 132 without balls, as illustrated in FIGS. 1 and 2. This is the case in particular of the first row $L_1$ of which the temperature is the highest.

There thus appears a need to perfect the structure of light emitting diodes to reduce temperature differences in the matrix array of light emitting diodes.

SUMMARY OF THE INVENTION

The present invention aims to improve the distribution of the thermal load in a matrix array of electronic devices belonging to an electronic structure.

According to the invention, this aim is attained by providing an electronic structure comprising a plurality of electronic devices arranged in the form of a matrix array comprising a first number of rows, the electronic devices of each row being connected in series, the matrix array further comprising a plurality of switches, the rows of the matrix array being distributed in a second number of groups intended to be connected in series by means of the switches, the groups connected in series being supplied with an electrical supply current, at least one of the groups comprising at least two rows connected in parallel so as to distribute the supply current between said at least two rows.

"Electronic structure" is taken to mean a device comprising at least two electronic components manufactured separately and assembled one on the other through an interconnection layer comprising for example solder balls. Such an assembly is designated "flip-chip".

The groups of the matrix array each have an active surface that depends on the number of rows that they comprise. The higher this number, the greater the active surface of the group. Thanks to the invention, it is possible to allocate the desired active surface to a group to improve the distribution of the electrical power injected into this group.

In the remainder of the description, the term "size", when it is used with reference to a group of rows, equally well designates the active surface of the group or the number of rows that the group comprises.

In a structure of the prior art, it is possible to consider that the groups are all constituted of a single row. All the groups thus have the same size. Conversely, in the structure according to the invention, the groups have sizes that may be different. Another advantage of the invention is thus to define groups of different sizes while conserving a regular matrix array, that is to say ensuring that the electronic devices have all substantially the same dimensions. This makes it possible to facilitate the implementation of the flip-chip assembly, which is preferably carried out with a regular matrix array.

According to an embodiment, the structure comprises a control device controlling the switches of the matrix array to connect in series the groups according to a predetermined order. Each group comprises a number of rows connected in parallel decreasing according to the order in which the groups are connected in series. An advantage is to adapt the active surface of each group by attributing to it more or less rows as a function of an electrical power injected into the group and the total number of groups on the chip.

According to an embodiment, the groups are formed by adjacent rows. An advantage is to facilitate the achievement of connections in parallel of the rows, and thus the manufacture of the matrix array.

According to an embodiment, the matrix array comprises at least two times more rows than groups. An advantage is to have a ratio between the number of rows and the number of groups sufficiently high to make it possible to facilitate the distribution.

According to an embodiment, the first number of rows of the matrix array is a second multiple integer of the number of groups.

According to an embodiment, the matrix array consumes a total electrical power, the first number of rows of the matrix array being sufficiently high so that each group consumes an electrical power such that the difference between the total power divided by the number of groups and the power of each group is less than 40%. An advantage is to maintain the thermal gradient present in the matrix array below a predetermined value.

According to an embodiment, the electronic devices are light emitting devices.

According to an embodiment, the light emitting devices are planar light emitting diodes.

According to an embodiment, the light emitting devices are nanowire or microwire light emitting diodes.

BRIEF DESCRIPTION OF THE FIGURES

The invention and its different applications will be better understood on reading the description that follows and by examining the figures that accompany it, among which.

The figures are only presented for indicative purposes and in no way limit the invention.

For greater clarity, identical or similar elements are marked by identical reference signs in all of the figures.

DETAILED DESCRIPTION OF EMBODIMENTS OF THE INVENTION

Figure 4:
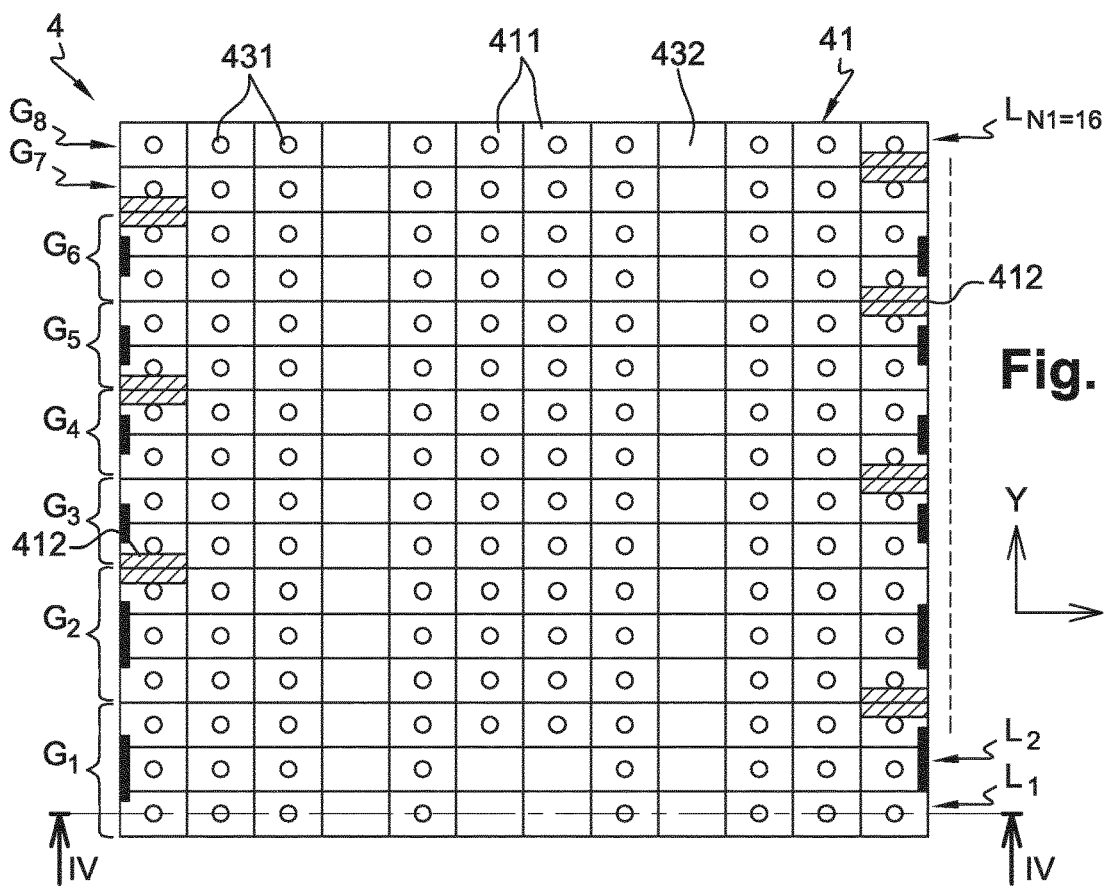
FIG. 4 is a schematic top view of a light emitting diode structure according to the invention.
Figure 5:
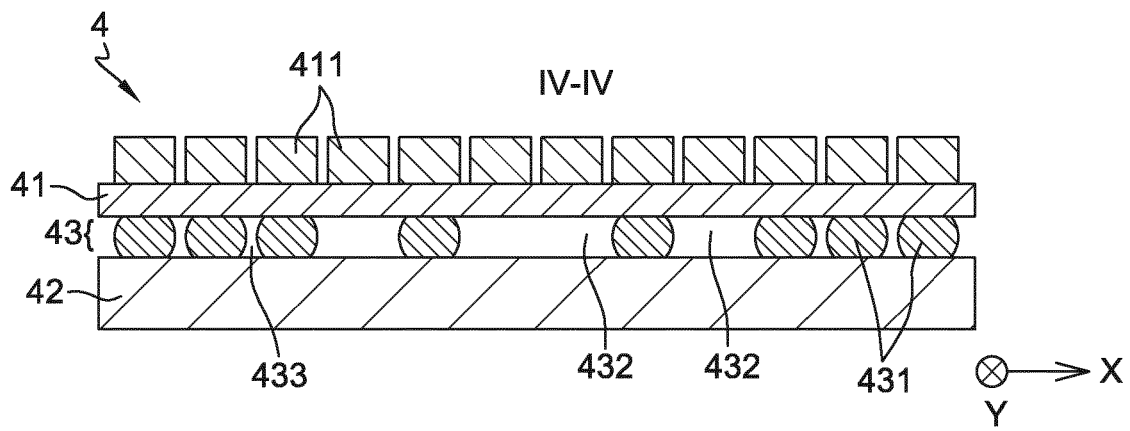
FIG. 5 is a schematic sectional view of the structure of FIG. 4 along the plane of section IV-IV.

An embodiment of an electronic structure 4 according to the invention will now be described with reference to FIGS. 4 and 5. The structure 4 comprises a first component 41, in this case a matrix array 41 of light emitting diodes 411, and a second component 42, in this case a control device 42 making it possible to address the matrix array 41. These two components 41, 42 are manufactured independently of each other, each on its own substrate, for example made of silicon. The matrix array 41 and the control device 42 operate in a complementary manner and are assembled by means of an interconnection layer 43 arranged between the matrix array 41 and the control device 42.

Each light emitting diode 411 forms a pixel 411 of the matrix array 41. The light emitting diodes 411 may be planar diodes, also designated two-dimensional (2D) diodes, or nanowire or microwire diodes. The light emitting diodes 411 are preferably identical.

The matrix array 41 comprises a first number N1 of rows $L_j$ (j being a natural integer comprised between 1 and N1) extending along a first direction X. For example, the number N1 of rows $L_j$ of the matrix array 41 of FIG. 4 is equal to 16. The rows $L_j$ are arranged one next to the other along a second direction Y orthogonal to the first direction X. The pixels 411 have a first dimension, called "width", along the first direction X and a second dimension, called "height", along the second direction Y. The light emitting diodes 411 of each row $L_j$ are connected in series. The rows $L_j$ of the matrix array 41 of FIG. 4 comprise a same number of pixels, for example equal to 12.

The rows $L_j$ of the matrix array 41 are distributed in a second number N2 of groups $G_k$ (k being a natural integer comprised between 1 and N2), each group $G_k$ comprising either a single row, or several rows connected in parallel. The rows $L_j$ constituting the groups $G_k$ are connected in parallel in a fixed manner, that is to say during the manufacture of the matrix array 41. Preferably, the rows $L_j$ that each group $G_k$ comprises are adjacent. Thus, the connection in parallel of such rows is simple to achieve, which facilitates the manufacture of the matrix array 41. For example, the number N2 of groups $G_k$ in the matrix array 41 of FIG. 4 is equal to 8, the two first groups $G_1$ and $G_2$ each comprising 3 rows $L_j$ connected in parallel, the groups $G_3$ to $G_6$ each comprising 2 rows $L_j$ connected in parallel, and the two final groups $G_7$ and $G_8$ each only comprising a single row $L_j$. The manner according to which this distribution is carried out will be described in greater detail hereafter.

The matrix array 41 also comprises switches 412 commanded in a dynamic manner by the control device 42 to connect in series the groups $G_k$. The switches 412 are arranged at the end of a row, as illustrated in FIG. 4.

The interconnection layer 43 preferably comprises solder balls 431 arranged under the pixels of the matrix array according to a predetermined interconnection pattern linked to the assembly constraints of the matrix array on the control device. Due to these constraints, the interconnection layer 43 has free spaces 432 without any balls. The interconnection layer 43 also comprises a filling material 433 which fills the free space between the balls 431. The filling material 433 may be an organic material, such as an epoxy resin or silicone, filled or not. The filling material 433 ensures the mechanical strength of the assembly.

Each ball 431 forms a mechanical and thermal connection between the matrix array 41 and the control device 42. It is to be noted that the free spaces 432 offer a lower thermal dissipation than the balls 431, in a ratio of the order of 5. The balls 431 are formed from an electrically conductive fusible material. A passivation layer (not represented) is advantageously intercalated between the balls 431 and the matrix array 41 to isolate electrically the matrix array from the control device 42. The passivation layer comprises openings situated under certain pixels. In addition to a mechanical and thermal connection, a ball placed in correspondence with an opening also forms an electrical connection between the matrix array 41 and the control device 42. Openings are notably present under the pixels 411 arranged at the end of a row, these pixels 411 constituting electrical current input and output points.

Figure 6:
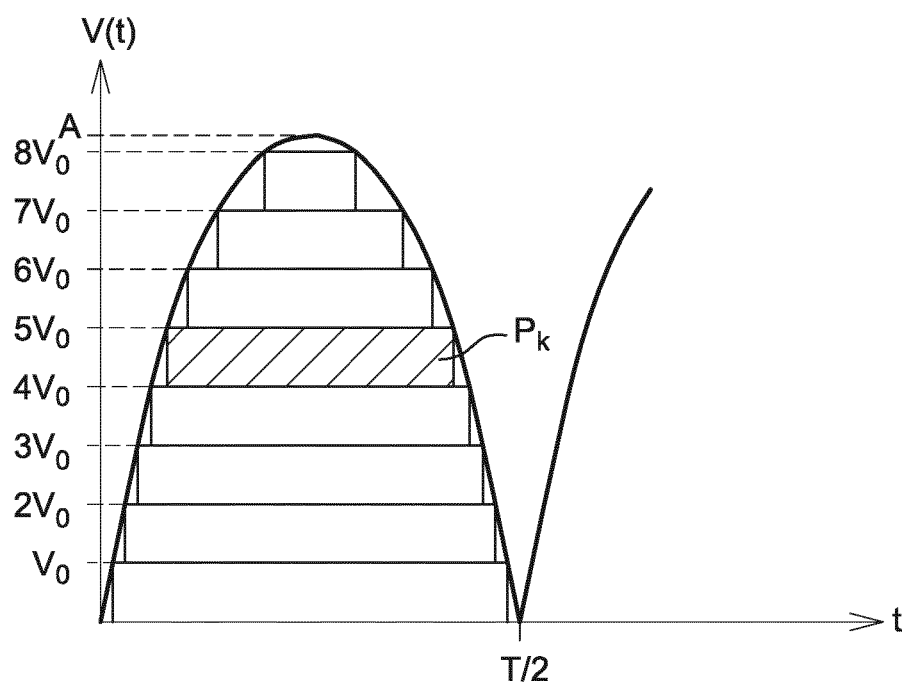
FIG. 6 represents an example of a supply voltage of the structure of FIG. 4.

In operation, the structure 4 is supplied with an alternating supply voltage. The supply voltage V(t) may come from an electrical supply network such as the home network. FIG. 6 shows an example of a sinusoidal supply voltage V(t) applied to the structure 4, this voltage V(t) having a period T and an amplitude A. Preferably, the supply voltage V(t) is rectified before being applied to the input of the structure 4.

The control device 42 is for example an ASIC (Application-Specific Integrated Circuit). It notably has the function of determining the number of groups $G_k$ to supply as a function of the value of the supply voltage at a given instant. Each group $G_k$ has a threshold voltage $V_k$ (k being a natural integer comprised between 1 and N2) that the control device 42 must supply to the matrix array 41 to supply the group $G_k$. According to the embodiment of FIG. 4, all the rows $L_j$ of the matrix array 41 comprise the same number of pixels. Consequently, all the groups $G_k$ have substantially the same threshold voltage $V_0$. Each time that the supply voltage reaches a multiple of the threshold voltage $V_0$, an additional group is supplied while being connected in series, through switches 412, with the groups already supplied.

In a more detailed manner, when the supply voltage reaches $V_0$, the first group $G_1$ is supplied. Next, when the supply voltage reaches $2V_0$, the first group $G_1$ and the second group $G_2$ are connected in series and supplied. This continues until all of the groups $G_k$ of the matrix array 41 are supplied. When the supply voltage is strictly comprised between $V_0$ and $2V_0$, the voltage value applied to the first group $G_1$ is maintained at $V_0$. Generally, the voltage applied to each row $L_j$ is limited by the control device 42 to the threshold voltage $V_0$.

FIG. 6 thereby shows the distribution of the electrical power $P_k$ injected into each group $G_k$ over a half-period of the supply voltage. The numerical values of this power, expressed in Watts, are reported in table 1 below, each group receiving a supply current of 50 mA. Table 1 also gives the values of the duty ratio of the supply of each group $G_k$. This value reflects the duration, taken over a period T of the supply voltage V(t), during which each group $G_k$ is supplied.

TABLE 1

| Group | Duty ratio (%) | Average power (W) |
|---|---|---|
| $G_1$ | 91 | 1.7 |
| $G_2$ | 84 | 1.6 |
| $G_3$ | 76 | 1.4 |
| $G_4$ | 68 | 1.3 |
| $G_5$ | 60 | 1.1 |
| $G_6$ | 51 | 0.9 |
| $G_7$ | 40 | 0.7 |
| $G_8$ | 26 | 0.5 |

The electrical power injected into each group $G_k$ is directly linked to the frequency at which it is supplied. Indeed, the groups $G_k$ have the same threshold voltage $V_0$ and receive an electrical current that has substantially the same value for all the groups $G_k$. Part of the electrical power is converted by the light emitting diodes 411 into thermal power. In other words, when they are supplied, the light emitting diodes 411 heat up, and the more often they are supplied the more they heat up. The aim of the invention is to improve the distribution of the electrical power injected into the matrix array 41, and thus to improve the distribution of the heat generated by the light emitting diodes 411. To do so, groups $G_k$ are formed of different sizes by connecting in parallel the rows $L_j$ of the matrix array 41. At equal power, a greater size implies a reduced power density, thus lower heating.

The groups $G_k$ are connected in series in a predetermined order, from the first group $G_1$ to the final group $G_{N2}$. Consequently, the lower the index k of a group $G_k$, the higher the electrical power injected into this group $G_k$. Conversely, the higher the index k of a group $G_k$, the lower the electrical power injected into this group $G_k$. According to the embodiment of FIG. 4, the number of rows $L_j$ that each group $G_k$ comprises decreases at the same time as the index k of the group $G_k$ increases. Thus, the size and the injected electrical power of each group $G_k$ follow a same progression curve.

Figure 1:
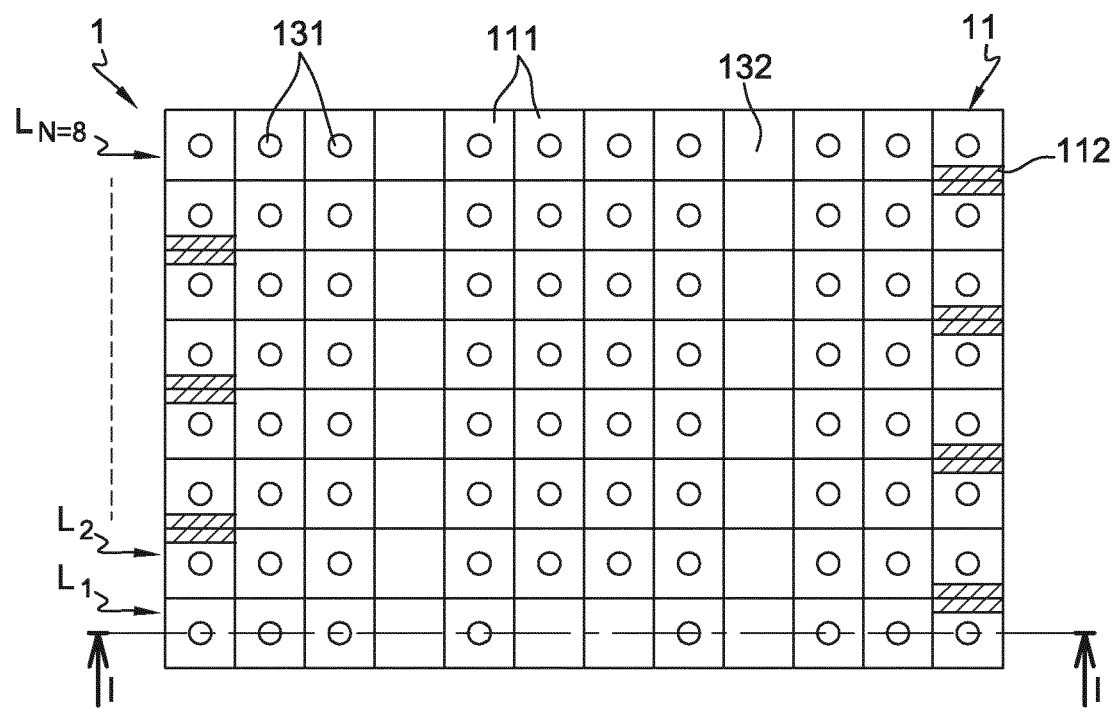
FIG. 1 is a schematic top view of a light emitting diode structure according to the prior art.
Figure 2:
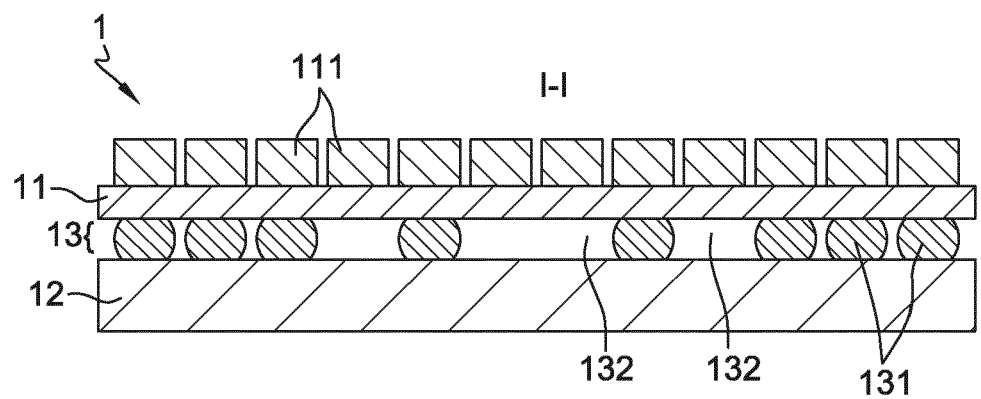
FIG. 2 is a schematic sectional view of the structure of FIG. 1 along the plane of section I-I.
Figure 3:
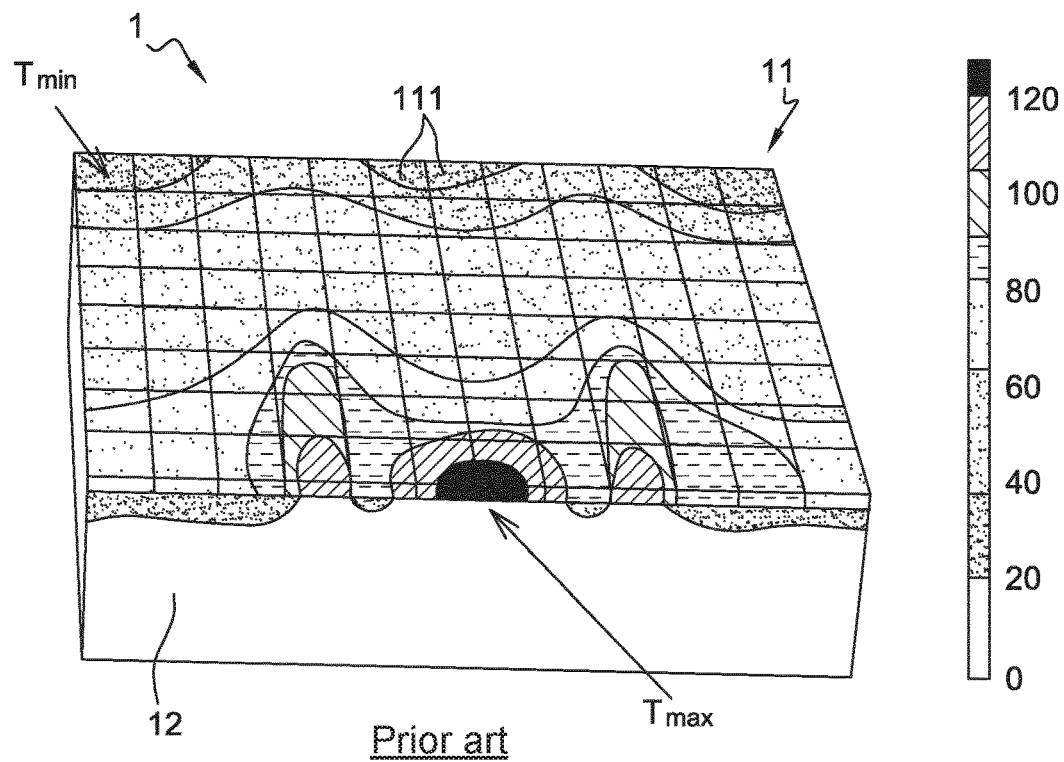
FIG. 3 is a mapping of the temperature on the surface of a light emitting diodes matrix array belonging to the structure of FIG. 1.
Figure 7:
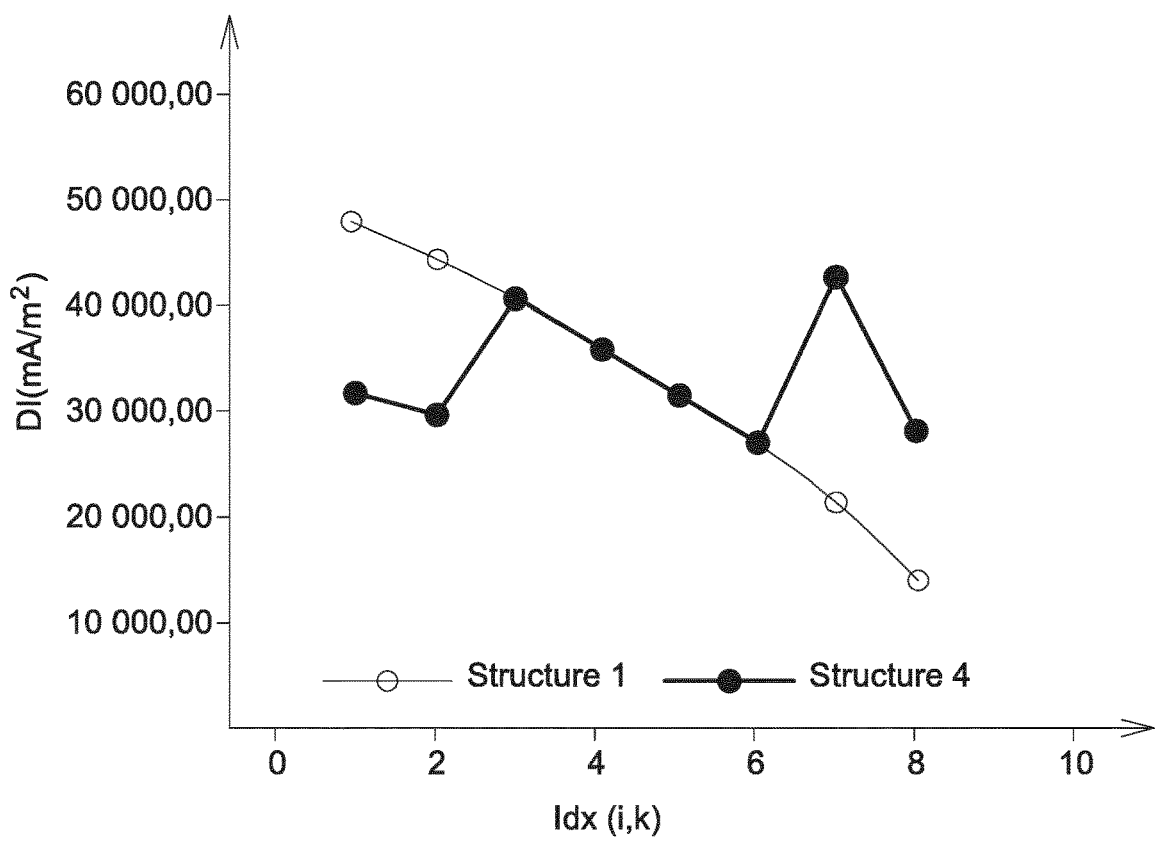
FIG. 7 represents the average electrical current density present in each group of the structure of FIG. 4 and in each row of the structure of FIG. 1, the two structures being supplied with the supply voltage of FIG. 6.

FIG. 7 shows a comparison of the average electrical current densities DI present in the groups $G_k$ of the structure 4 according to the invention and in the rows $L_i$ of the structure 1 of the prior art described with reference to FIG. 1, as a function of the index Idx of the row or of the group. The comparison is all the more appropriate so as the matrix arrays 11, 41 of the two structures 1, 4 have the same size. The height of the pixels 411 of the structure 4 according to the invention has been divided by 2 with respect to the height of the pixels 111 of the structure 1 of the prior art, but the structure 4 has two times more rows (16) than the structure 1 (8). It may be noted that the difference between the maximum and the minimum of the current density DI in the different groups $G_k$ of the structure 4 is more reduced than in the different rows $L_i$ in the structure 1. The invention thus makes it possible to homogenise the electrical consumption of light emitting diodes 411, and thus the thermal load.

Figure 8:
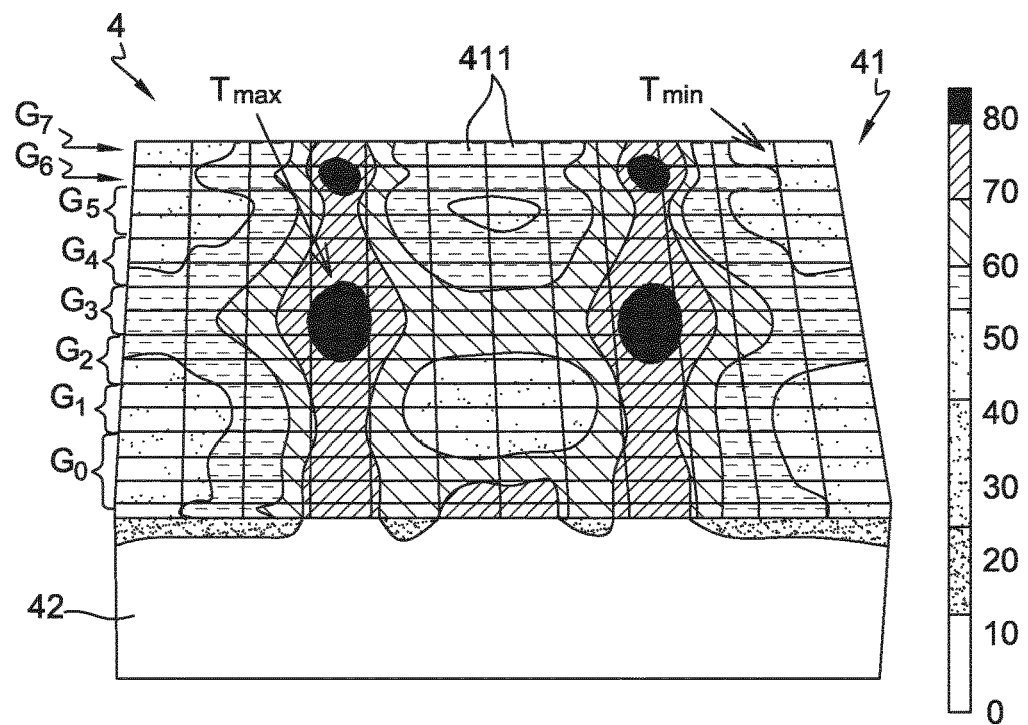
FIG. 8 is a mapping of the temperature on the surface of a light emitting diodes matrix array belonging to the structure of FIG. 4.

The gain obtained at the level of the temperatures present on the surface of the matrix array 41 of the structure 4 is illustrated in FIG. 8. The maximum temperature $T_{max}$ is around 86° C. and the minimum temperature $T_{min}$ is around 58° C. A better distribution of heat is thus observed, with a low thermal gradient, less than 30° C. in this case.

Thanks to the invention, the problem of distribution of the thermal load is solved by allocating to each group $G_k$ a surface adapted to its electrical energy consumption while conserving a regular matrix array comprising pixels of constant dimensions. Indeed, the assembly of the matrix array 41 on the control device 42 is preferably achieved on a regular matrix array 41. For example, a constant size of pixels makes it possible to arrange solder balls of identical sizes, which ensures the planeness of the structure 1.

The matrix array 41 consumes a total power that may be calculated. By dividing this total power by the number of group $G_k$, an average power per group is obtained. Advantageously, the rows $L_j$, are distributed in the groups $G_k$ so as to minimise the difference between the average power per group and the power actually injected into each group $G_k$ in order to distribute the power in an optimal manner. Preferably, this difference is fixed less than 40%, and even more preferentially less than 20%. The greater the number N1 of rows $L_j$ that the matrix array 41 comprises, the more it is possible to approach the power injected into each group $G_k$ of the average power.

Of course, the invention is not limited to the embodiments described with reference to the figures and variants could be envisaged without going beyond the scope of the invention. In particular, although the invention has been described in relation with a light emitting diode structure, the invention may be applied to other types of electronic structures comprising electronic devices arranged in the form of a matrix array, these structures having similar problems of energy distribution within the matrix array.

The invention claimed is:

1. An electronic structure comprising a plurality of electronic devices arranged in the form of a matrix array comprising a first number of rows, the electronic devices of each row being connected in series, wherein the matrix array further comprises a plurality of switches and wherein the rows of the matrix array are distributed in a number of groups being connected in series by means of the switches, the groups connected in series being supplied with an electrical supply current, at least one of the groups comprising connectors and at least two rows that are electrically connected in parallel with said connectors to distribute the supply current between said at least two rows and improve distribution of thermal load in the matrix array.

2. The electronic structure according to claim 1, further comprising a control device for controlling the switches of the matrix array to connect in series the groups according to a predetermined order, each group comprising a number of rows connected in parallel decreasing according to the order in which the groups are connected in series.

3. The electronic structure according to claim 1, wherein the groups are formed by adjacent rows.

4. The electronic structure according to claim 1, wherein the matrix array comprises at least two times more rows than groups.

5. The electronic structure according to claim 1, wherein the first number of rows of the matrix array is a multiple integer of the number of groups.

6. The electronic structure according to claim 1, wherein the matrix array consumes a total electrical power when the groups are supplied with the electrical supply current, the first number of rows of the matrix array being sufficiently high so that each group consumes an average electrical power that corresponds to a ratio between the total electrical power divided by the number of groups, wherein the difference between the average electrical power consumed by each group and the power actually consumed by each group is less than 40%.

7. The electronic structure according to claim 1, wherein the electronic devices are light emitting devices.

8. The electronic structure according to claim 7, wherein the light emitting devices are planar light emitting diodes.

9. The electronic structure according to claim 7, wherein the light emitting devices are nanowire or microwire light emitting diodes.

* * * * *